(12) United States Patent
Serizawa et al.

(10) Patent No.: US 8,921,027 B2
(45) Date of Patent: *Dec. 30, 2014

(54) RADIATION-SENSITIVE RESIN COMPOSITION

(75) Inventors: Ryuichi Serizawa, Tokyo (JP); Nobuji Matsumura, Tokyo (JP); Hirokazu Sakakibara, Tokyo (JP)

(73) Assignee: JSR Corporation, Tokyo (JP)

( * ) Notice: Subject to any disclaimer, the term of this patent is extended or adjusted under 35 U.S.C. 154(b) by 40 days.

This patent is subject to a terminal disclaimer.

(21) Appl. No.: 13/326,328

(22) Filed: Dec. 15, 2011

(65) Prior Publication Data

US 2012/0082936 A1    Apr. 5, 2012

Related U.S. Application Data

(63) Continuation of application No. PCT/JP2010/060029, filed on Jun. 14, 2010.

(30) Foreign Application Priority Data

Jun. 16, 2009  (JP) ................................ 2009-143360
Jan. 12, 2010  (JP) ................................ 2010-004188

(51) Int. Cl.
| | | |
|---|---|---|
| G03F 7/004 | (2006.01) | |
| G03F 7/029 | (2006.01) | |
| G03F 7/039 | (2006.01) | |
| C08F 220/28 | (2006.01) | |
| C08F 8/34 | (2006.01) | |
| C08F 220/18 | (2006.01) | |
| C08F 220/38 | (2006.01) | |

(52) U.S. Cl.
CPC .............. *G03F 7/0045* (2013.01); *G03F 7/029* (2013.01); *G03F 7/039* (2013.01); *G03F 7/0046* (2013.01); *G03F 7/0392* (2013.01); *G03F 7/0397* (2013.01); *C08F 220/18* (2013.01); *C08F 220/28* (2013.01); *C08F 220/38* (2013.01); *C08F 8/34* (2013.01); *Y10S 430/111* (2013.01); *Y10S 430/12* (2013.01); *Y10S 430/122* (2013.01); *Y10S 430/126* (2013.01)
USPC ........ 430/270.1; 430/910; 430/919; 430/921; 430/925

(58) Field of Classification Search
USPC ............... 430/270.1, 910, 919, 921, 923, 925
See application file for complete search history.

(56) References Cited

U.S. PATENT DOCUMENTS

| 4,491,628 | A | 1/1985 | Ito et al. | |
|---|---|---|---|---|
| 7,390,613 | B1 * | 6/2008 | Rahman et al. ............ | 430/270.1 |
| 2002/0025489 | A1 | 2/2002 | Shimada et al. | |
| 2009/0035692 | A1 | 2/2009 | Tarutani et al. | |
| 2010/0119974 | A1 | 5/2010 | Hada et al. | |
| 2010/0190104 | A1 | 7/2010 | Nakamura et al. | |
| 2010/0203452 | A1 | 8/2010 | Nishimura et al. | |
| 2010/0221664 | A1 | 9/2010 | Nishimura et al. | |
| 2011/0223537 | A1 * | 9/2011 | Ebata et al. ................ | 430/270.1 |
| 2012/0065291 | A1 * | 3/2012 | Matsumura et al. .......... | 522/183 |
| 2012/0156621 | A1 | 6/2012 | Nakamura et al. | |
| 2012/0264061 | A1 | 10/2012 | Hada et al. | |

FOREIGN PATENT DOCUMENTS

| EP | 1736824 A2 | 12/2006 |
|---|---|---|
| EP | 1736824 A3 | 12/2006 |
| JP | H2-27660 B | 3/1984 |
| JP | 2002-006482 | 1/2002 |
| JP | 2009-53688 | 3/2009 |
| JP | 2009-191055 | 8/2009 |
| JP | 2009191055 A * | 8/2009 |
| JP | 2010-116352 | 5/2010 |
| TW | 200905399 | 2/2009 |
| WO | WO 2008/014313 A2 | 1/2008 |
| WO | WO 2008/014313 A3 | 1/2008 |
| WO | WO 2009/041556 | 4/2009 |

OTHER PUBLICATIONS

Utsumi et al., JP 2009-191055 A (English Translation), 2009.*
International Search Report for corresponding International Application No. PCT/JP2010/060029, Jul. 6, 2010.
Written opinion for corresponding International Application No. PCT/JP2010/060029, Jul. 6, 2010.
J.V. Crivello, Cationic Polymerization-Iodonium and Sulfonium Salt Photoinitiators, Advances in Polymer Science, 1984, p. 1-48, vol. 62.
Taiwanese Notice of Allowance for corresponding TW Application No. 099119287, Aug. 5, 2013.
Extended European Search Report for corresponding EP Application No. 10789454.5-1564, May 3, 2013.
Japanese Office Action for corresponding JP Application No. 2011-519769, Apr. 22, 2014.

* cited by examiner

*Primary Examiner* — Anca Eoff
(74) *Attorney, Agent, or Firm* — Oblon, Spivak, McClelland, Maier & Neustadt, L.L.P.

(57) ABSTRACT

A radiation-sensitive resin composition includes an acid-labile group-containing resin, and a compound shown by the following general formula (i). $R^1$ represents a hydrogen atom or the like, $R^2$ represents a single bond or the like, $R^3$ represents a linear or branched unsubstituted monovalent hydrocarbon group having 1 to 10 carbon atoms or the like, and $X^+$ represents an onium cation.

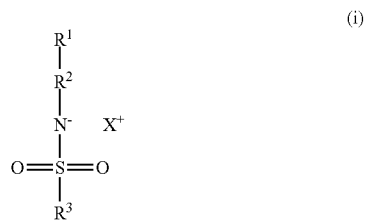

(i)

4 Claims, No Drawings

RADIATION-SENSITIVE RESIN COMPOSITION

CROSS-REFERENCE TO RELATED APPLICATIONS

The present application is a continuation application of International Application No. PCT/JP2010/060029, filed Jun. 14, 2010, which claims priority to Japanese Patent Application No. 2009-143360, filed Jun. 16, 2009 and to Japanese Patent Application No. 2010-004188, filed Jan. 12, 2010. The contents of these applications are incorporated herein by reference in their entirety.

BACKGROUND OF THE INVENTION

1. Field of the Invention

The invention relates to a radiation-sensitive resin composition.

2. Discussion of the Background

When applying deep ultraviolet rays (e.g., KrF excimer laser light or ArF excimer laser light) or the like to a chemically-amplified radiation-sensitive resin composition, an acid is generated in the exposed area, and a difference in solubility rate in a developer occurs between the exposed area and the unexposed area due to chemical reactions catalyzed by the acid. A resist pattern is formed on a substrate by utilizing the difference in solubility rate.

When precisely controlling the line width (e.g., when the device design dimensions are equal to or less than sub-half micrometers), it is important for a chemically-amplified resist to exhibit excellent resolution, show small line width roughness (LWR) (i.e., an index of a variation in line width of a resist pattern), and produce a rectangular pattern. Technology that adds a basic compound as an acid diffusion controller that adjusts the acid diffusion rate has been disclosed in order to control a fine shape (see Japanese Examined Patent Publication (KOKOKU) No. 2-27660 and Japanese Patent Application Publication (KOKAI) No. 2009-53688, for example). An acid diffusion controller that dissociates due to an acid and loses acid diffusion controllability has attracted attention since high contrast between the exposed area and the unexposed area is obtained.

SUMMARY OF THE INVENTION

According to one aspect of the present invention, a radiation-sensitive resin composition includes an acid-labile group-containing resin, and a compound shown by a general formula (i).

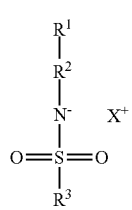

(i)

$R^1$ represents a hydrogen atom, a linear or branched unsubstituted monovalent hydrocarbon group having 1 to 10 carbon atoms, a linear or branched monovalent hydrocarbon group having 1 to 10 carbon atoms in which at least one hydrogen atom is substituted with a fluorine atom, a hydroxyl group, an —OR group, an —OCOR group, a —COOR group, or a monovalent hydrocarbon group having 3 to 20 carbon atoms in which all of the carbon atoms or a part of the carbon atoms form a cyclic structure, wherein R represents a linear or branched monovalent hydrocarbon group having 1 to 10 carbon atoms or a monovalent hydrocarbon group having 3 to 20 carbon atoms in which all of the carbon atoms or a part of the carbon atoms form a cyclic structure. $R^2$ represents a single bond or an —O—(C=O)— group. $R^3$ represents a linear or branched unsubstituted monovalent hydrocarbon group having 1 to 10 carbon atoms, a linear or branched monovalent hydrocarbon group having 1 to 10 carbon atoms in which at least one hydrogen atom is substituted with a fluorine atom, or a monovalent hydrocarbon group having 3 to 20 carbon atoms in which all of the carbon atoms or a part of the carbon atoms form a cyclic structure. $X^+$ represents an onium cation.

DESCRIPTION OF THE EMBODIMENTS

The embodiment of the invention provides the following radiation-sensitive resin composition.

[1] A radiation-sensitive resin composition including (A) an acid-labile group-containing resin (hereinafter may be referred to as "resin (A)"), and (C) a compound shown by a general formula (i) (hereinafter may be referred to as "compound (C)"),

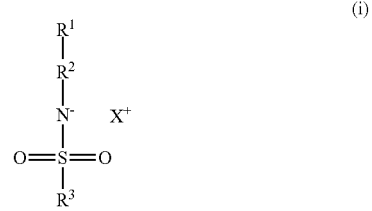

(i)

wherein $R^1$ represents a hydrogen atom, a linear or branched monovalent hydrocarbon group having 1 to 10 carbon atoms in which some or all of hydrogen atoms may be substituted with a fluorine atom, a hydroxyl group, an —OR group, an —OCOR group, or a —COOR group, or a monovalent hydrocarbon group having 3 to 20 carbon atoms that includes a cyclic structure or a partially cyclic structure, R represents a linear or branched monovalent hydrocarbon group having 1 to 10 carbon atoms or a monovalent hydrocarbon group having 3 to 20 carbon atoms that includes a cyclic structure or a partially cyclic structure, $R^2$ represents a single bond or an —O—(C=O)— group, $R^3$ represents a linear or branched monovalent hydrocarbon group having 1 to 10 carbon atoms in which some or all of hydrogen atoms may be substituted with a fluorine atom, or a monovalent hydrocarbon group having 3 to 20 carbon atoms that includes a cyclic structure or a partially cyclic structure, and $X^+$ represents an onium cation.

[2] The radiation-sensitive resin composition according to [1], wherein $X^+$ in the general formula (i) is at least one of an onium cation shown by a general formula (1-1) and an onium cation shown by a general formula (1-2), (1-1)

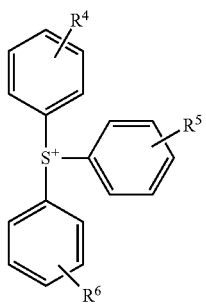

(1-2)

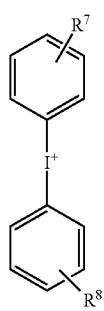

wherein $R^4$ to $R^8$ individually represent a hydrogen atom, a hydroxyl group, a nitro group, a halogen atom, a substituted or unsubstituted alkyl group having 1 to 10 carbon atoms, a cycloalkyl group having 3 to 12 carbon atoms, or an alkoxy group having 1 to 10 carbon atoms.

[3] The radiation-sensitive resin composition according to [1], further including (B) a photoacid generator (hereinafter may be referred to as "acid generator (B)").

[4] The radiation-sensitive resin composition according to [1], wherein the acid-labile group-containing resin (A) includes a repeating unit shown by a general formula (2) (hereinafter may be referred to as "repeating unit (2)"), (2)

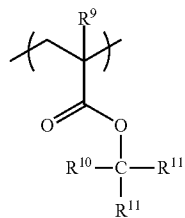

wherein $R^9$ represents a hydrogen atom, a methyl group, or a trifluoromethyl group, $R^{10}$ represents an alkyl group having 1 to 4 carbon atoms or a monovalent alicyclic hydrocarbon group having 4 to 20 carbon atoms, and $R^{11}$ individually represent an alkyl group having 1 to 4 carbon atoms or a monovalent alicyclic hydrocarbon group having 4 to 20 carbon atoms, provided that $R^{11}$ may bond to each other to form a divalent alicyclic hydrocarbon group having 4 to 20 carbon atoms together with the carbon atom bonded to $R^{11}$.

The above radiation-sensitive resin composition can form a resist pattern that shows small LWR and has an excellent pattern shape, and ensures that the resist pattern does not collapse (i.e., an accurate pattern is formed) even when forming a fine line pattern.

1. Acid-Labile Group-Containing Resin (A)

The resin (A) is insoluble or scarcely soluble in an alkali. The resin (A) includes a protecting group (acid-labile group) that dissociates due to an acid, and becomes alkali-soluble upon dissociation (elimination) of the protecting group due to an acid. The expression "insoluble or scarcely soluble in an alkali" used herein means that a film (thickness: 100 nm) that is formed only of the resin (A) has a thickness equal to or more than 50% of the initial thickness when developed under alkaline development conditions employed when forming a resist pattern using a resist film that is formed of the radiation-sensitive resin composition that includes the resin (A).

The resin (A) may include a repeating unit that includes an acid-labile group. The repeating unit (2) is preferable as the repeating unit that includes an acid-labile group.

Specific examples of the alkyl group having 1 to 4 carbon atoms represented by $R^{10}$ and $R^{11}$ in the general formula (2) include a methyl group, an ethyl group, an n-propyl group, an i-propyl group, an n-butyl group, a 2-methylpropyl group, a 1-methylpropyl group, a t-butyl group, and the like. Specific examples of the monovalent alicyclic hydrocarbon group having 4 to 20 carbon atoms include cycloalkyl groups such as a cyclobutyl group, a cyclopentyl group, a cyclohexyl group, a cycloheptyl group, and a cyclooctyl group, groups that include a bridged alicycle skeleton, such as a dicyclopentanyl group, a dicyclopentenyl group, a tricyclodecyl group, a tetracyclododecyl group, an adamantyl group, and the like. Specific examples of the divalent alicyclic hydrocarbon group having 4 to 20 carbon atoms formed by $R^{11}$ together with the carbon atom bonded to $R^{11}$ include a group obtained by removing one hydrogen atom from a monovalent alicyclic hydrocarbon group having 4 to 20 carbon atoms.

Examples of a preferable repeating unit (2) include repeating units shown by the following general formulas (2-1) to (2-13). Note that $R^9$ in the general formulas (2-1) to (2-13) represents a hydrogen atom, a methyl group, or a trifluoromethyl group.

(2-1)

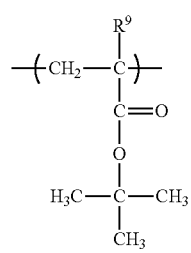

(2-2)

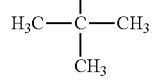

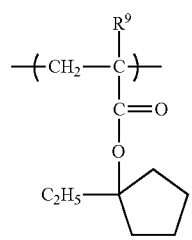 (2-3)
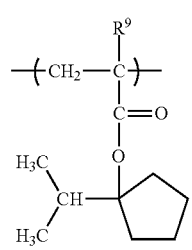 (2-4)
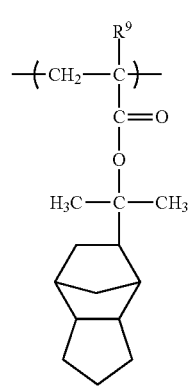 (2-5)
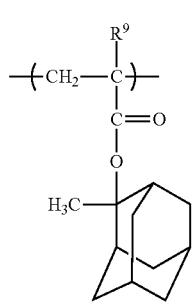 (2-6)
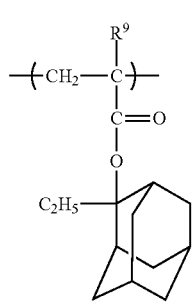 (2-7)
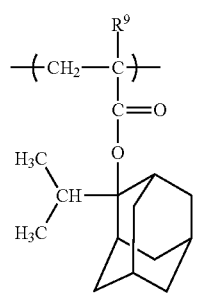 (2-8)
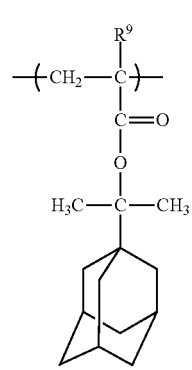 (2-9)
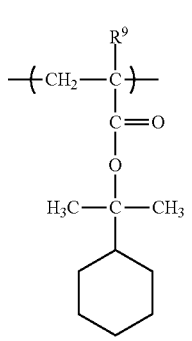 (2-10)
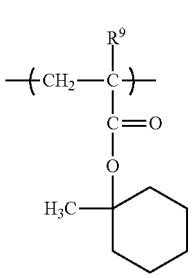 (2-11)
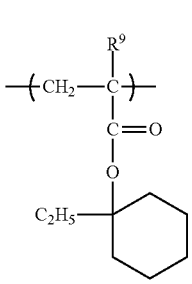 (2-12)

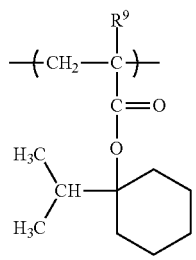

(2-13)

The resin (A) may include an additional repeating unit. Examples of a preferable additional repeating unit include a repeating unit that includes a lactone skeleton and a repeating unit that includes a cyclic carbonate skeleton.

Examples of the repeating unit that includes a lactone skeleton include repeating units derived from 5-oxo-4-oxatricyclo[4.2.1.0$^{3,7}$]non-2-yl(meth)acrylate, 9-methoxycarbonyl-5-oxo-4-oxatricyclo[4.2.1.0$^{3,7}$]non-2-yl(meth)acrylate, 5-oxo-4-oxatricyclo[5.2.1.0$^{3,8}$]dec-2-yl(meth)acrylate, 10-methoxycarbonyl-5-oxo-4-oxatricyclo[5.2.1.0$^{3,8}$]dec-2-yl(meth)acrylate, 6-oxo-7-oxabicyclo[3.2.1]oct-2-yl(meth)acrylate, 4-methoxycarbonyl-6-oxo-7-oxabicyclo[3.2.1]oct-2-yl(meth)acrylate, 7-oxo-8-oxabicyclo[3.3.1]non-2-yl(meth)acrylate, 4-methoxycarbonyl-7-oxo-8-oxabicyclo[3.3.1]non-2-yl(meth)acrylate, 2-oxotetrahydropyran-4-yl(meth)acrylate, 4-methyl-2-oxotetrahydropyran-4-yl(meth)acrylate, 4-ethyl-2-oxotetrahydropyran-4-yl(meth)acrylate, 4-propyl-2-oxotetrahydropyran-4-yl(meth)acrylate, 5-oxotetrahydrofuran-3-yl(meth)acrylate, 2,2-dimethyl-5-oxotetrahydrofuran-3-yl(meth)acrylate, 4,4-dimethyl-5-oxotetrahydrofuran-3-yl(meth)acrylate, 2-oxotetrahydrofuran-3-yl(meth)acrylate, 4,4-dimethyl-2-oxotetrahydrofuran-3-yl(meth)acrylate, 5,5-dimethyl-2-oxotetrahydrofuran-3-yl(meth)acrylate, 2-oxotetrahydrofuran-3-yl(meth)acrylate, 5-oxotetrahydrofuran-2-ylmethyl(meth)acrylate, 3,3-dimethyl-5-oxotetrahydrofuran-2-ylmethyl(meth)acrylate, 4,4-dimethyl-5-oxotetrahydrofuran-2-ylmethyl(meth)acrylate, and the like.

Examples of the repeating unit that includes a cyclic carbonate skeleton include a repeating unit shown by the following general formula (3). Note that R$^9$ in the general formula (3) represents a hydrogen atom, a methyl group, or a trifluoromethyl group.

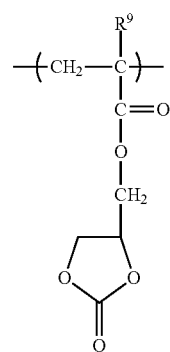

(3)

The resin (A) may include a further additional repeating unit. Examples of the further additional repeating unit include a repeating unit derived from a (meth)acrylate. Specific examples of the (meth)acrylate include hydroxyl group-containing (meth)acrylates, carboxyl group-containing (meth)acrylates, and the like.

The content of the repeating unit (2) in the resin (A) is preferably 20 to 80 mol %, and particularly preferably 25 to 75 mol %, based on the total repeating units included in the resin (A). If the content of the repeating unit (2) is less than 20 mol %, the resolution may deteriorate due to insufficient solubility. If the content of the repeating unit (2) exceeds 80 mol %, adhesion to a substrate may deteriorate.

(Method of Producing Resin (A))

The resin (A) may be produced by an arbitrary method. For example, the resin (A) may be produced by polymerizing a polymerizable unsaturated monomer corresponding to each repeating unit that forms the desired molecular composition in an appropriate solvent in the presence of a radical initiator, a chain transfer agent, and the like. It is preferable to add the radical initiator at a sufficiently high concentration so that a sufficient polymerization rate is achieved. If the ratio of the radical initiator to the chain transfer agent is too large, however, a radical-radical coupling reaction may occur, so that an undesired non-living radical polymer may be produced. As a result, a polymer for which the polymer properties (e.g., molecular weight and molecular weight distribution) are not controlled may be obtained. Therefore, the molar ratio of the radical initiator to the chain transfer agent is preferably set to 1:1 to 0.005:1.

Examples of the radical initiator include, but are not limited to, a thermal polymerization initiator, a redox polymerization initiator, and a photoinitiator. Specific examples of the radical initiator include peroxide initiators such as t-butyl hydroperoxide, t-butyl perbenzoate, and benzoyl peroxide, azo compounds such as 2,2'-azobis(2,4-dimethylvaleronitrile), 2,2'-azobisisobutyronitrile (AIBN), 1,1'-azobis(cyclohexanecarbonitrile), and dimethyl 2,2'-azobisisobutyrate (MAIB), and the like. Examples of the chain transfer agent include pyrazole derivatives, alkylthiols, and the like.

The monomers may be polymerized by batch polymerization, dropwise polymerization, or the like. For example, polymerizable unsaturated monomers corresponding to the repeating unit (2), the additional repeating unit, and the further additional repeating unit may be dissolved in an organic solvent, and polymerized in the presence of a radical initiator and a chain transfer agent to obtain the resin (A). An organic solvent that can normally dissolve a polymerizable unsaturated monomer, a radical initiator, and a chain transfer agent is used as the polymerization solvent. Examples of such an organic solvent include ketone solvents, ether solvents, aprotic polar solvents, ester solvents, aromatic solvents, and linear or cyclic aliphatic solvents.

Specific examples of the ketone solvents include methyl ethyl ketone, acetone, and the like. Specific examples of the ether solvents include dimethyl ether, diethyl ether, tetrahydrofuran, 1,4-dioxane, and the like. Specific examples of the aprotic polar solvents include dimethylformamide, dimethylsulfoxide, and the like. Examples of the ester solvents include alkyl acetates such as ethyl acetate and methyl acetate. Specific examples of the aromatic solvents include alkylaryl solvents such as toluene and xylene, and halogenated aromatic solvents such as chlorobenzene. Specific examples of the aliphatic solvents include hexane, cyclohexane, and the like.

The polymerization temperature is normally 20 to 120° C., preferably 50 to 110° C., and more preferably 60 to 100° C. The monomers may be polymerized in air, but are preferably polymerized in an inert gas (e.g., nitrogen or argon) atmosphere. The polymerization time is normally 0.5 to 144 hours, preferably 1 to 72 hours, and more preferably 2 to 24 hours.

The resin (A) may or may not include a residue derived from the chain transfer agent at the end of the molecular chain. The resin (A) may include part of a residue derived from the chain transfer agent at the end of the molecular chain.

It is preferable that the resin (A) have a low impurity (e.g., halogen and metal) content as much as possible. It is preferable that the content of residual monomers and oligomers in the resin (A) determined by HPLC be 0.1 mass % or less. This makes it possible to improve the sensitivity, the resolution, the process stability, the pattern shape, and the like of the resist, and produce a radiation-sensitive resin composition that produces a resist that does not show a change with time (e.g., a change in the content of foreign matter or a change in sensitivity).

The resin (A) may be purified as follows, for example. Specifically, impurities (e.g., metal) may be removed by causing metals included in the solution of the resin (A) to be adsorbed on a zeta-potential filter, or washing the solution of the resin (A) with an acidic aqueous solution (e.g., oxalic acid or sulfonic acid aqueous solution) to remove metals in a chelate state, for example. The content of residual monomers and oligomer components may be reduced to a value equal to or smaller than a given value by liquid-liquid extraction that removes residual monomers and oligomer components by washing with water, an appropriate solvent, and the like, solution-state purification (e.g., ultrafiltration) that extracts and removes only components having a molecular weight equal to or less than a specific value, reprecipitation that removes residual monomers and the like by adding a solution of the resin (A) dropwise to a poor solvent to effect coagulation, or solid-state purification that washes the polymer slurry separated by filtration with a poor solvent, for example. These methods may be used in combination. The poor solvent used for reprecipitation may be appropriately selected depending on the properties of the resin (A) (polymer) and the like.

The polystyrene-reduced weight average molecular weight (hereinafter referred to as "Mw") of the resin (A) determined by gel permeation chromatography (GPC) is normally 1000 to 300,000, preferably 2000 to 300,000, and more preferably 2000 to 120,000. If the Mw of the resin (A) is less than 1000, the heat resistance of the resulting resist may deteriorate. If the Mw of the resin (A) exceeds 300,000, the developability of the resist may deteriorate. The ratio (Mw/Mn) of the Mw to the polystyrene-reduced number average molecular weight (hereinafter referred to as "Mn") of the resin (A) determined by gel permeation chromatography (GPC) is preferably 1 to 5, more preferably 1 to 3, and particularly preferably 1 to 1.6. Note that the molecular weight of the resin (A) may be adjusted by adjusting the ratio of the amount of monomers to the amount of the chain transfer agent.

2. Photoacid Generator (B)

The acid generator (B) generates an acid upon exposure to radiation. Note that the term "radiation" used herein includes active rays such as deep ultraviolet rays (e.g., KrF excimer laser light (wavelength: 248 nm) and ArF excimer laser light (wavelength: 193 nm)).

Examples of the acid generator (B) include onium salts (e.g., sulfonium salt and iodonium salt), organic halogen compounds, and sulfone compounds (e.g., disulfone and diazomethanesulfone). Examples of a preferable acid generator (B) include triphenylsulfonium salts such as triphenylsulfonium trifluoromethanesulfonate, triphenylsulfonium nonafluoro-n-butanesulfonate, triphenylsulfonium 2-(bicyclo[2.2.1]hept-2'-yl)-1,1-difluoroethanesulfonate, triphenylsulfonium perfluoro-n-octanesulfonate, triphenylsulfonium 2-(bicyclo[2.2.1]hept-2'-yl)-1,1,2,2-tetrafluoroethanesulfonate, triphenylsulfonium camphorsulfonate, triphenylphosphonium 1,1,2,2-tetrafluoro-6-(1-adamantanecarbonyloxy)hexane-1-sulfonate, and triphenylsulfonium 2-adamantyl-1,1-difluoroethanesulfonate;

4-cyclohexylphenyldiphenylsulfonium salts such as 4-cyclohexylphenyldiphenylsulfonium trifluoromethane sulfonate, 4-cyclohexylphenyldiphenylsulfonium nonafluoro-n-butanesulfonate, 4-cyclohexylphenyldiphenylsulfonium perfluoro-n-octanesulfonate, 4-cyclohexylphenyldiphenylsulfonium 2-bicyclo[2.2.1]hept-2-yl-1,1,2,2-tetrafluoroethanesulfonate, and 4-cyclohexylphenyldiphenylsulfonium camphorsulfonate;

4-methanesulfonylphenyldiphenylsulfonium salts such as 4-methanesulfonylphenyldiphenylsulfonium trifluoromethanesulfonate, 4-methanesulfonylphenyldiphenylsulfonium nonafluoro-n-butanesufonate, 4-methanesulfonylphenyldiphenylsulfonium perfluoro-n-octanesulfonate, 4-methanesulfonylphenyldiphenylsulfonium 2-bicyclo[2.2.1]hept-2-yl-1,1,2,2-tetrafluoroethanesulfonate, and 4-methanesulfonylphenyldiphenylsulfonium camphorsulfonate;

diphenyliodonium salts such as diphenyliodonium trifluoromethanesulfonate, diphenyliodonium nonafluoro-n-butanesufonate, diphenyliodonium perfluoro-n-octanesulfonate, diphenyliodonium 2-bicyclo[2.2.1]hept-2-yl-1,1,2,2-tetrafluoroethanesulfonate, and diphenyliodonium camphorsulfonate;

bis(4-t-butylphenyl)iodonium salts such as bis(4-t-butylphenyl)iodonium trifluoromethanesulfonate, bis(4-t-butylphenyl)iodonium nonafluoro-n-butanesulfonate, bis(4-t-butylphenyl)iodonium perfluoro-n-octanesulfonate, bis(4-t-butylphenyl)iodonium 2-bicyclo[2.2.1]hept-2-yl-1,1,2,2-tetrafluoroethanesulfonate, and bis(4-t-butylphenyl) iodonium camphorsulfonate;

1-(4-n-butoxynaphthalen-1-yl)tetrahydrothiophenium salts such as 1-(4-n-butoxynaphthalen-1-yl)tetrahydrothiophenium trifluoromethanesulfonate, 1-(4-n-butoxynaphthalen-1-yl)tetrahydrothiophenium nonafluoro-n-butanesulfonate, 1-(4-n-butoxynaphthalen-1-yl)tetrahydrothiophenium perfluoro-n-octanesulfonate, 1-(4-n-butoxynaphthalen-1-yl)tetrahydrothiophenium-2-bicyclo[2.2.1]hept-2-yl-1,1,2,2-tetrafluoroethanesulfonate, and 1-(4-n-butoxynaphthalen-1-yl)tetrahydrothiophenium camphorsulfonate;

1-(4-n-butoxynaphthalen-2-yl)tetrahydrothiophenium salts such as 1-(6-n-butoxynaphthalen-2-yl)tetrahydrothiophenium trifluoromethanesulfonate, 1-(6-n-butoxynaphthalen-2-yl)tetrahydrothiophenium nonafluoro-n-butanesulfonate, 1-(6-n-butoxynaphthalen-2-yl)tetrahydrothiophenium perfluoro-n-octanesulfonate, 1-(6-n-butoxynaphthalen-2-yl)tetrahydrothiophenium 2-bicyclo[2.2.1]hept-2-yl-1,1,2,2-tetrafluoroethanesulfonate, and 1-(6-n-butoxynaphthalen-2-yl)tetrahydrothiophenium camphorsulfonate;

1-(3,5-dimethyl-4-hydroxyphenyl)tetrahydrothiophenium salts such as 1-(3,5-dimethyl-4-hydroxyphenyl)tetrahydrothiophenium trifluoromethanesulfonate, 1-(3,5-dimethyl-4-hydroxyphenyl)tetrahydrothiophenium nonafluoro-n-butanesulfonate, 1-(3,5-dimethyl-4-hydroxyphenyl) tetrahydrothiophenium perfluoro-n-octanesulfonate, 1-(3,5-dimethyl-4-hydroxyphenyl)tetrahydrothiophenium 2-bicyclo[2.2.1]hept-2-yl-1,1,2,2-tetrafluoroethanesulfonate, and 1-(3,5-dimethyl-4-hydroxyphenyl)tetrahydrothiophenium camphorsulfonate;

bicyclo[2.2.1]hept-5-ene-2,3-dicarboxyimide compounds such as N-(trifluoromethanesulfonyloxy)bicyclo[2.2.1]hept- 5-ene-2,3-dicarboxyimide, N-(nonafluoro-n-butanesulfonyloxy)bicyclo[2.2.1]hept-5-ene-2,3-dicarboxyimide, N-(perfluoro-n-octanesulfonyloxy)bicyclo[2.2.1]hept-5-ene-2,3-dicarboxyimide, N-(2-bicyclo[2.2.1]hept-2-yl-1,1,2,2-tetrafluoroethanesulfonyloxy)bicyclo[2.2.1]hept-5-ene-2,3-dicarboxyimide, N-(2-(3-tetracyclo[6.2.1.1$^{3,6}$.0$^{2,7}$]dodecanyl)-1,1-difluoroethanesulfonyloxy)bicyclo[2.2.1]hept-5-ene-2,3-dicarboxyimide, and N-(camphorsulfonyloxy)bicyclo[2.2.1]hept-5-ene-2,3-dicarboxyimide; and the like.

These acid generators (B) may be used either individually or in combination. The acid generator (B) is preferably used in an amount of 0.1 to 30 parts by mass, and more preferably 0.1 to 20 parts by mass, based on 100 parts by mass of the resin (A), so that the resulting resist exhibits excellent sensitivity and developability. If the amount of the acid generator (B) is less than 0.1 parts by mass, the sensitivity and the developability of the resist may deteriorate. If the amount of the acid generator (B) exceeds 30 parts by mass, a rectangular resist pattern may not be obtained due to a decrease in transparency to radiation. Note that the acid generator (B) need not be used when the structural unit of the resin (A) or another polymer that may be used together with the resin (A) generates an acid upon exposure to radiation.

3. Compound (C) Shown by General Formula (i)

The compound (C) is shown by the general formula (i), and preferably generates a weak acid having a pKa of about 3 to 8 upon exposure. The acid-labile group included in the resin (A) (e.g., the acid-labile group included in the repeating unit (2)) has a structure that does not dissociate due to such a weak acid. The acid generated by the acid generator (B) upon exposure preferably has a pKa of 2 or less. The compound (C) present in the unexposed area undergoes an ion-exchange reaction with the acid generated by the acid generator (B), and suppresses an acid diffusion phenomenon. The compound (C) present in the exposed area is decomposed, and loses basicity with respect to the acid generated by the acid generator (B). Therefore, excellent contrast between the exposed area and the unexposed area is obtained by utilizing the radiation-sensitive resin composition that includes the compound (C). Moreover, the resist pattern does not collapse even when forming a fine line pattern, so that an accurate pattern can be formed.

Examples of the linear or branched monovalent hydrocarbon group having 1 to 10 carbon atoms represented by $R^1$ and $R^3$ in the general formula (i) include a methyl group, an ethyl group, an n-propyl group, an i-propyl group, an n-butyl group, an i-butyl group, a sec-butyl group, a t-butyl group, an n-pentyl group, an i-pentyl group, an n-hexyl group, an n-heptyl group, an n-octyl group, an n-nonyl group, an n-decyl group, and the like. Examples of the monovalent hydrocarbon group having 3 to 20 carbon atoms that includes a cyclic structure or a partially cyclic structure include cycloalkyl groups such as a cyclopropyl group, a cyclobutyl group, a cyclopentyl group, a cyclohexyl group, and a cyclooctyl group, groups that include a bridged alicycle skeleton, such as a dicyclopentanyl group, a dicyclopentenyl group, a tricyclodecyl group, a tetracyclododecyl group, and an adamantyl group, alkylcycloalkyl groups such as a methylcyclohexyl group and an ethylcyclohexyl group, groups that include an alkyl-substituted bridged alicycle skeleton, such as a methyladamantyl group, and the like. These groups may be bonded to $R^2$ via a divalent hydrocarbon chain. Examples of the linear or branched monovalent hydrocarbon group having 1 to 10 carbon atoms or the monovalent hydrocarbon group having 3 to 20 carbon atoms that includes a cyclic structure or a partially cyclic structure represented by R included in the —OR group, the —OCOR group, or the —COOR group include those mentioned above in connection with $R^1$ and $R^3$. Examples of a preferable compound (C) include compounds shown by the following general formulas (i-1) to (i-36). Note that $X^+$ in the general formulas (i-1) to (i-36) represents an onium cation.

(i-1)

(i-2)

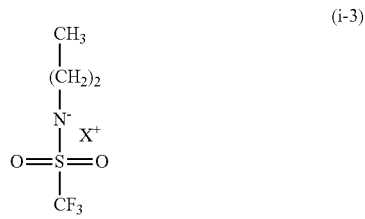

(i-3)

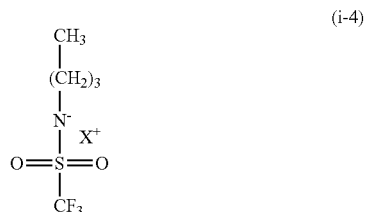

(i-4)

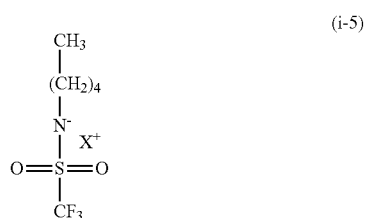

(i-5)

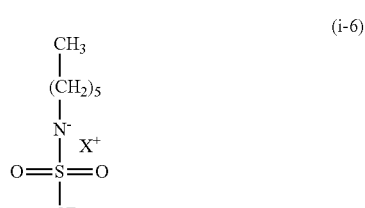

(i-6)

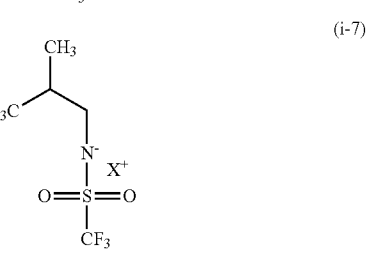

(i-7)

-continued
(i-8)
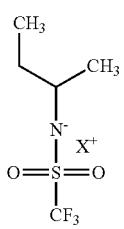
(i-9)
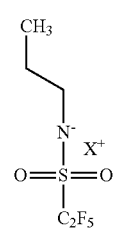
(i-10)
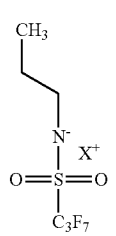
(i-11)
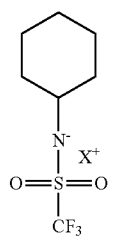
(i-12)
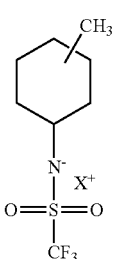
(i-13)
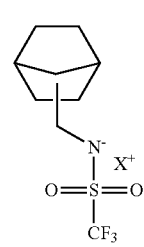
-continued
(i-14)
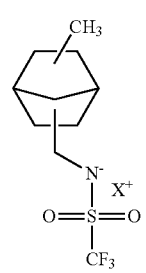
(i-15)
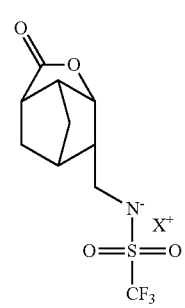
(i-16)
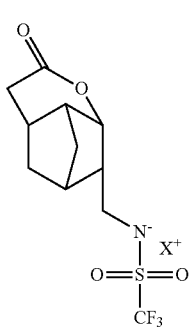
(i-17)
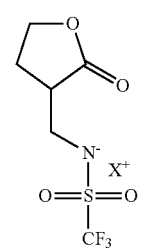
(i-18)
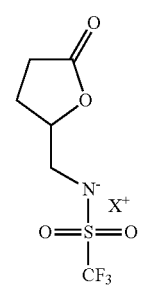

-continued
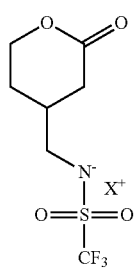 (i-19)
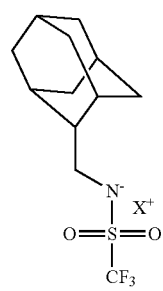 (i-20)
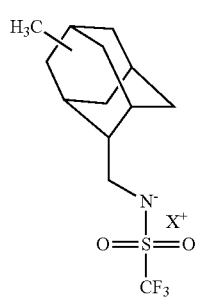 (i-21)
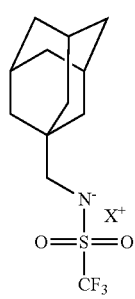 (i-22)
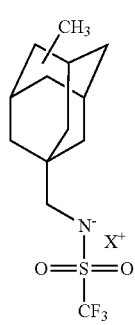 (i-23)
-continued
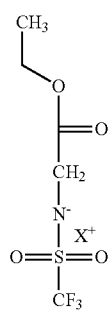 (i-24)
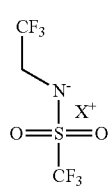 (i-25)
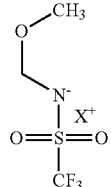 (i-26)
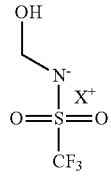 (i-27)
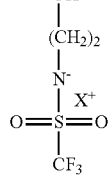 (i-28)
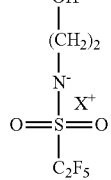 (i-29)
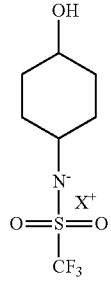 (i-30)

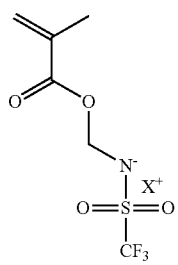 (i-31)

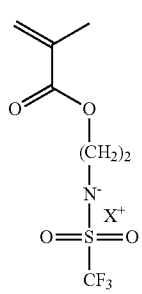 (i-32)

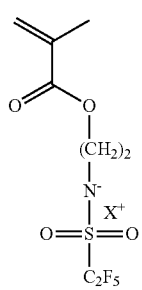 (i-33)

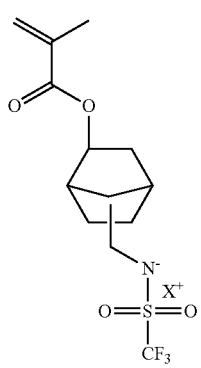 (i-34)

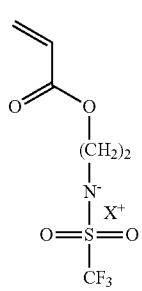 (i-35)

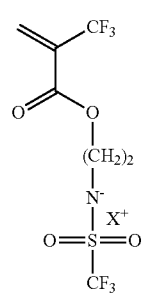 (i-36)

It is preferable that the onium cation represented by $X^+$ in the general formulas (i-1) to (i-36) be at least one of the onium cation shown by the general formula (1-1) and the onium cation shown by the general formula (1-2).

Specific examples of the sulfonium cation shown by the general formula (1-1) include the sulfonium cations shown by the following general formulas (1-1-1) to (1-1-21). Specific examples of the iodonium cation shown by the general formula (1-2) include the iodonium cations shown by the following general formulas (1-2-1) to (1-2-27).

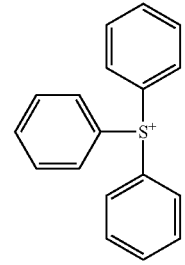 (1-1-1)

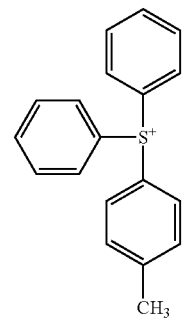 (1-1-2)

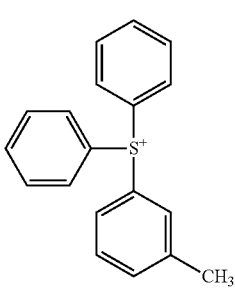 (1-1-3)

-continued
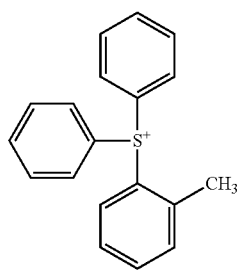
(1-1-4)
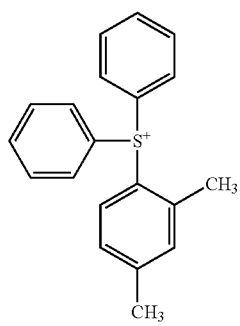
(1-1-5)
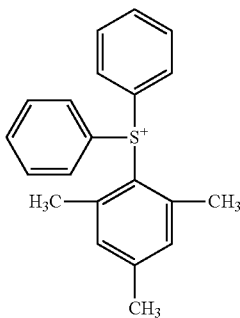
(1-1-6)
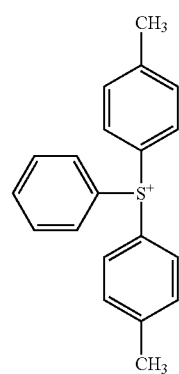
(1-1-7)
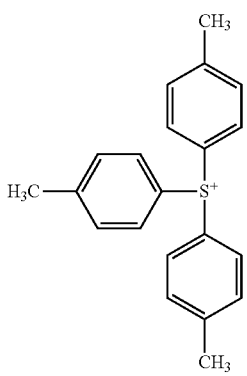
(1-1-8)
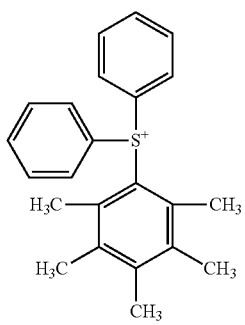
(1-1-9)
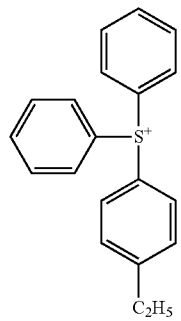
(1-1-10)
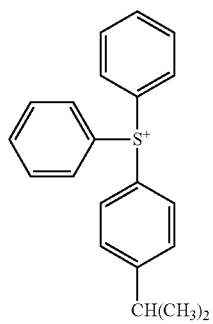
(1-1-11)

(1-1-12)
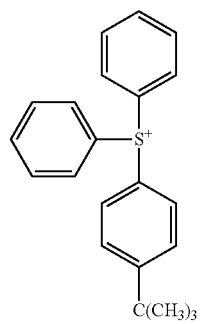
(1-1-13)
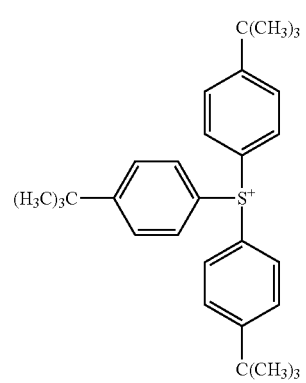
(1-1-14)
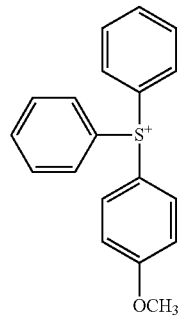
(1-1-15)
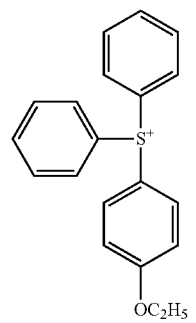
(1-1-16)
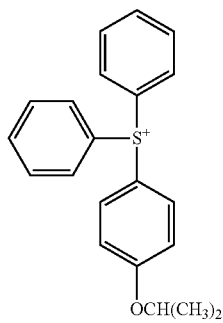
(1-1-17)
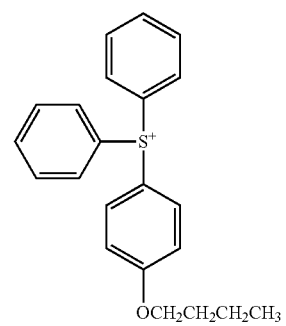
(1-1-18)
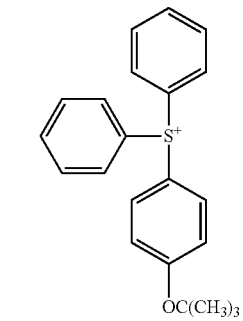
(1-1-19)
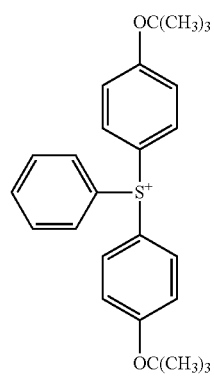

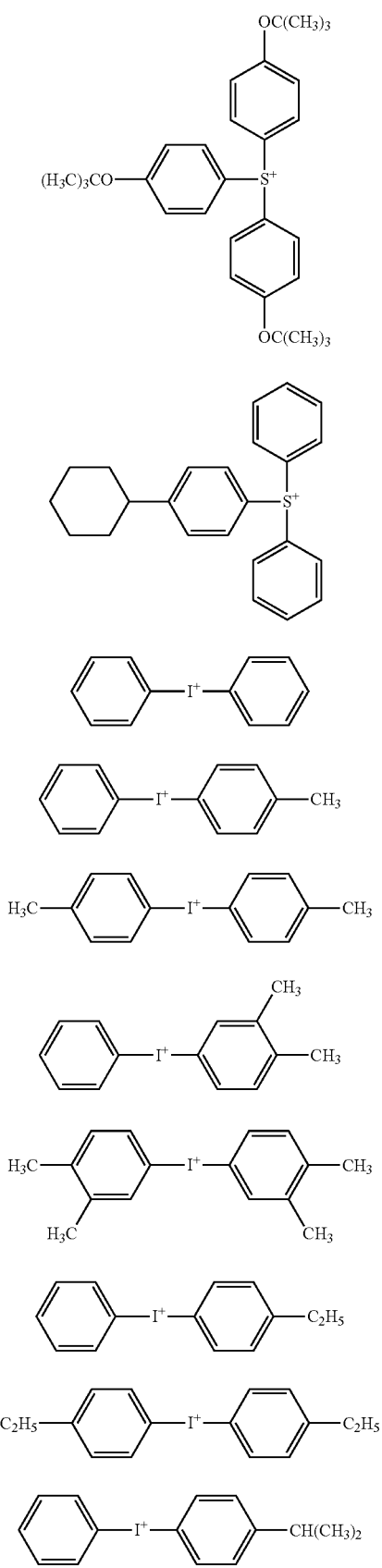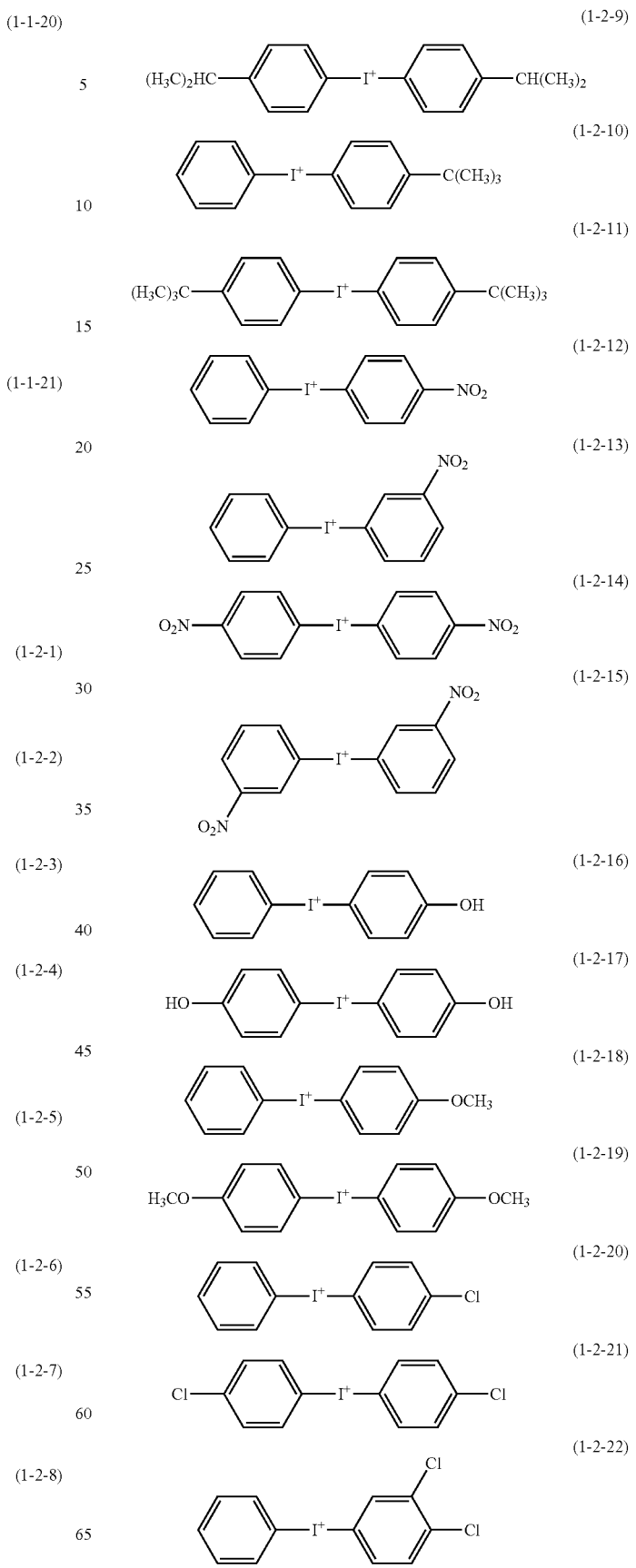

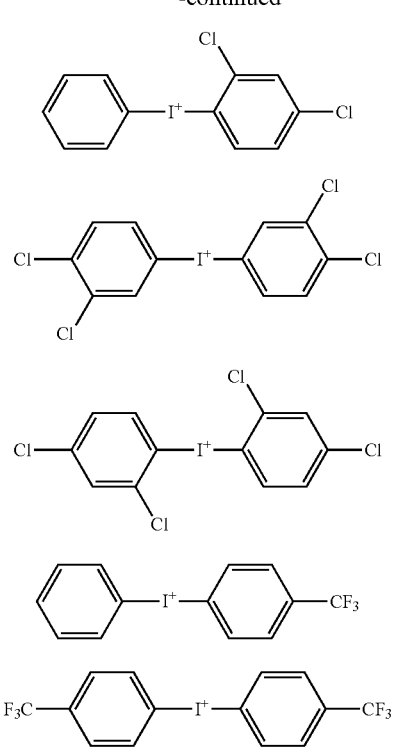

The monovalent onium cation represented by M⁺ in the general formulas (i) and (i-1) to (i-36) may be produced by the method described in Advances in Polymer Science, vol. 62, pp. 1-48 (1984), for example.

These compounds (C) may be used either individually or in combination. The compound (C) is preferably used in an amount of 0.001 to 20 parts by mass, and more preferably 0.001 to 12 parts by mass, based on 100 parts by mass of the resin (A). If the amount of the compound (C) is less than 0.001 parts by mass, the sensitivity of the resist and the developability of the exposed area may deteriorate. If the amount of the compound (C) exceeds 20 parts by mass, the shape or the dimensional accuracy of the resist pattern may deteriorate depending on the process conditions.

4. Additional Component

The radiation-sensitive resin composition according to one embodiment of the invention may optionally include an additive (additional component) such as an additional acid diffusion controller, an alicyclic additive, a surfactant, or a sensitizer.

Since the compound (C) has acid diffusion controllability, excellent resolution, an excellent pattern shape, and small LWR can be obtained even if the additional acid diffusion controller is not used. However, the additional acid diffusion controller may be used in combination with the compound (C). A nitrogen-containing organic compound other than the compound (C) may preferably used as the additional acid diffusion controller.

The nitrogen-containing organic compound is not particularly limited. Examples of the nitrogen-containing organic compound include mono(cyclo)alkylamines, di(cyclo)alkylamines, tri(cyclo)alkylamines, substituted alkylamines, aromatic amines, diamine compounds, polyethylenimine, polyallylamines, poly(2-dimethylaminoethylacrylamide), amide group-containing compounds, urea compounds, nitrogen-containing heterocyclic compounds, and the like.

The nitrogen-containing compound is preferably used in an amount of 15 parts by mass or less, more preferably 10 parts by mass or less, and particularly preferably 5 parts by mass or less, based on 100 parts by mass of the resin (A). The lower limit of the amount of the nitrogen-containing compound is not particularly limited, but is normally 0.001 parts by mass. If the amount of the nitrogen-containing compound exceeds 15 parts by mass, the sensitivity of the resist and the developability of the exposed area may deteriorate. If the amount of the nitrogen-containing compound is less than 0.001 parts by mass, the shape or the dimensional accuracy of the resist pattern may deteriorate depending on the process conditions.

The alicyclic additive further improves the dry etching resistance, the pattern shape, adhesion to a substrate, and the like, and may include an acid-labile group.

Examples of the alicyclic additive include adamantane derivatives such as t-butyl 1-adamantanecarboxylate, t-butoxycarbonylmethyl 1-adamantanecarboxylate, α-butyrolactone 1-adamantanecarboxylate, di-t-butyl 1,3-adamantanedicarboxylate, t-butyl 1-adamantaneacetate, t-butoxycarbonylmethyl 1-adamantaneacetate, di-t-butyl 1,3-adamantanediacetate, and 2,5-dimethyl-2,5-di(adamantylcarbonyloxy)hexane;

deoxycholates such as t-butyl deoxycholate, t-butoxycarbonylmethyl deoxycholate, 2-ethoxyethyl deoxycholate, 2-cyclohexyloxyethyl deoxycholate, 3-oxocyclohexyl deoxycholate, tetrahydropyranyl deoxycholate, and mevalonolactone deoxycholate; lithocholates such as t-butyl lithocholate, t-butoxycarbonylmethyl lithocholate, 2-ethoxyethyl lithocholate, 2-cyclohexyloxyethyl lithocholate, 3-oxocyclohexyl lithocholate, tetrahydropyranyl lithocholate, and mevalonolactone lithocholate; and the like. These alicyclic additives may be used either individually or in combination.

An alkyl carboxylate such as dimethyl adipate, diethyl adipate, dipropyl adipate, di-n-butyl adipate, or di-t-butyl adipate may be used as an additive that has the the function as that of the alicyclic additive.

The surfactant improves the applicability, striation, developability, and the like. Examples of the surfactant include nonionic surfactants such as polyoxyethylene lauryl ether, polyoxyethylene stearyl ether, polyoxyethylene oleyl ether, polyoxyethylene n-octylphenyl ether, polyoxyethylene n-nonylphenyl ether, polyethylene glycol dilaurate, and polyethylene glycol distearate; commercially available products such as KP341 (manufactured by Shin-Etsu Chemical Co., Ltd.), Polyflow No. 75, Polyflow No. 95 (manufactured by Kyoeisha Chemical Co., Ltd.), EFTOP EF301, EFTOP EF303, EFTOP EF352 (manufactured by JEMCO, Inc.), Megafac F171, Megafac F173 (manufactured by DIC Corporation), Fluorad FC430, Fluorad FC431 (manufactured by Sumitomo 3M Ltd.), Asahi Guard AG710, Surflon S-382, Surflon SC-101, Surflon SC-102, Surflon SC-103, Surflon SC-104, Surflon SC-105, Surflon SC-106 (manufactured by Asahi Glass Co., Ltd.); and the like. These surfactants may be used either individually or in combination. The surfactant is preferably used in an amount of 2 parts by mass or less based on 100 parts by mass of the resin (A).

The sensitizer absorbs the energy of radiation, and transmits the energy to the acid generator (B), so that the amount of acid generated by the acid generator (B) increases. Specifically, the sensitizer improves the apparent sensitivity of the radiation-sensitive resin composition. Examples of the sensitizer include carbazoles, benzophenones, rose bengals, anthracenes, phenols, and the like. These sensitizers may be used either individually or in combination. The sensitizer is preferably used in an amount of 50 parts by mass or less based on 100 parts by mass of the resin (A).

(Production of Radiation-Sensitive Resin Composition)

The radiation-sensitive resin composition according to one embodiment of the invention is normally used as a radiation-sensitive resin composition solution by dissolving the components in a solvent so that the total solid content is 1 to 50 mass %, and preferably 3 to 25 mass %, and filtering the solution through a filter having a pore size of about 0.2 μm, for example. Examples of the solvent used to obtain the radiation-sensitive resin composition solution include linear or branched ketones such as 2-pentanone, 2-hexanone, 2-heptanone, and 2-octanone, cyclic ketones such as cyclopentanone and cyclohexanone, propylene glycol monoalkyl ether acetates such as propylene glycol monomethyl ether acetate and propylene glycol monoethyl ether acetate, alkyl 2-hydroxypropionates such as methyl 2-hydroxypropionate and ethyl 2-hydroxypropionate, alkyl 3-alkoxypropionates such as methyl 3-methoxypropionate, ethyl 3-methoxypropionate, methyl 3-ethoxypropionate, and ethyl 3-ethoxypropionate, ethylene glycol monomethyl ether, ethylene glycol monoethyl ether, diethylene glycol dimethyl ether, diethylene glycol diethyl ether, ethylene glycol monomethyl ether acetate, ethylene glycol monoethyl ether acetate, propylene glycol monomethyl ether, propylene glycol monoethyl ether, n-butyl acetate, methyl pyruvate, ethyl pyruvate, N-methylpyrrolidone, γ-butyrolactone, and the like.

These solvents may be used either individually or in combination. It is preferable to use at least one compound selected from propylene glycol monomethyl ether acetate, propylene glycol monomethyl ether, 2-heptanone, cyclohexanone, γ-butyrolactone, ethyl 2-hydroxypropionate, and ethyl 3-ethoxypropionate as the solvent.

The radiation-sensitive resin composition thus obtained may suitably be used to form a resist film by spin coating or the like used for photolithography.

EXAMPLES

The invention is further described below by way of examples. Note that the invention is not limited to the following examples. In the examples and comparative examples, the unit "parts" refers to "parts by mass", and the unit "%" refers to "mass %", unless otherwise specified. The following property value measuring methods and property evaluation methods were used.

Weight Average Molecular Weight (Mw) And Number Average Molecular Weight (Mn)

The weight average molecular weight (Mw) and the number average molecular weight (Mn) were determined by gel permeation chromatography (GPC) (standard: monodisperse polystyrene) using a GPC column manufactured by Tosoh Corporation (G2000HXL×2, G3000HXL×1, G4000HXL×1) (flow rate: 1.0 ml/min, column temperature: 40° C., eluant: tetrahydrofuran). The dispersity (Mw/Mn) was calculated from the measurement results.

$^{13}$C-NMR Analysis and $^{1}$H-NMR Analysis

Each polymer was subjected to $^{13}$C-NMR analysis and $^{1}$H-NMR analysis using a spectrometer "JNM-EX270" (manufactured by JEOL Ltd.).

Synthesis Example 1

Synthesis of Compound (C-1)

20 g of an ion-exchange resin ("QAE Sephadex A-25" manufactured by GE Healthcare Biosciences) was swollen overnight in ultrapure water, and introduced into a column tube. A solution prepared by dissolving 28 g of the sodium salt shown by the following formula (X-1) in methanol was introduced into the column tube charged with the ion-exchange resin, and the sulfonamide anion was supported on the ion-exchange resin. After backflushing with a sufficient amount of methanol, a solution prepared by dissolving 5.2 g of triphenylsulfonium chloride in methanol was introduced into the column tube to effect an anion-exchange reaction. After evaporating the solvent from the resulting solution using an evaporator, the residue was dried at room temperature overnight to obtain a compound shown by the following formula (C-1) (hereinafter referred to as "compound (C-1)") (yield: 8.0 g).

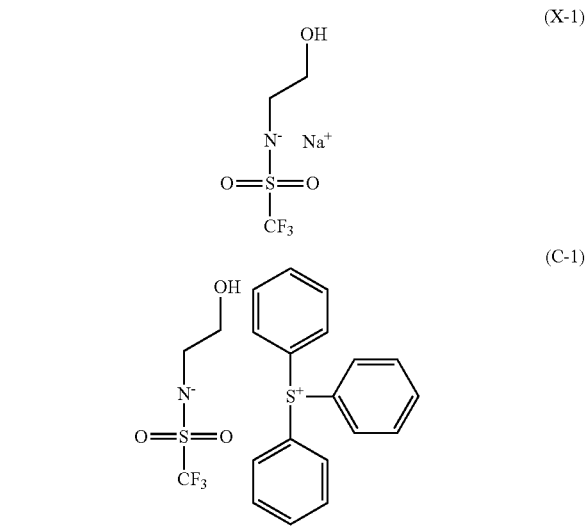

Synthesis Example 2

Synthesis of Compound (C-2)

20 g of an ion-exchange resin ("QAE Sephadex A-25" manufactured by GE Healthcare Biosciences) was swollen overnight in ultrapure water, and introduced into a column tube. A solution prepared by dissolving 28 g of the sodium salt shown by the following formula (X-1) in methanol was introduced into the column tube charged with the ion-exchange resin, and the sulfonamide anion was supported on the ion-exchange resin. After backflushing with a sufficient amount of methanol, a solution prepared by dissolving 5.6 g of diphenyliodonium chloride in methanol was introduced into the column tube to effect an anion-exchange reaction. After evaporating the solvent from the resulting solution using an evaporator, the residue was dried at room temperature overnight to obtain a compound shown by the following formula (C-2) (hereinafter referred to as "compound (C-2)") (yield: 8.2 g).

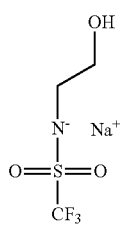

(X-1)

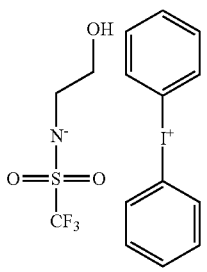

(C-2)

Synthesis Example 3

Synthesis of Compound (C-3)

20 g of an ion-exchange resin ("QAE Sephadex A-25" manufactured by GE Healthcare Biosciences) was swollen overnight in ultrapure water, and introduced into a column tube. A solution prepared by dissolving 28 g of the sodium salt shown by the following formula (X-2) in methanol was introduced into the column tube charged with the ion-exchange resin, and the sulfonamide anion was supported on the ion-exchange resin. After backflushing with a sufficient amount of methanol, a solution prepared by dissolving 5.8 g of triphenylsulfonium chloride in methanol was introduced into the column tube to effect an anion-exchange reaction. After evaporating the solvent from the resulting solution using an evaporator, the residue was dried at room temperature overnight to obtain a compound shown by the following formula (C-3) (hereinafter referred to as "compound (C-3)") (yield: 8.1 g).

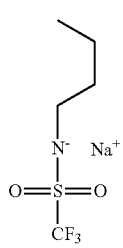

(X-2)

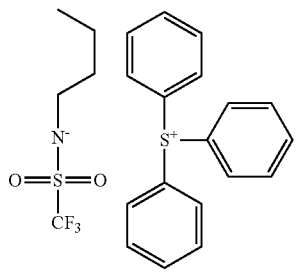

(C-3)

Synthesis Example 4

Synthesis of Compound (C-4)

20 g of an ion-exchange resin ("QAE Sephadex A-25" manufactured by GE Healthcare Biosciences) was swollen overnight in ultrapure water, and introduced into a column tube. A solution prepared by dissolving 28 g of the sodium salt shown by the following formula (X-3) (prepared by deprotonating an (X-3) derivative (manufactured by Central Glass Co., Ltd.) with a metal base (sodium hydrogen carbonate) in methanol was introduced into the column tube, and the sulfonamide anion was supported on the resin. After backflushing with a sufficient amount of methanol, a solution prepared by dissolving 5.2 g of triphenylsulfonium chloride in methanol was introduced into the column tube to effect an anion-exchange reaction. After evaporating the solvent from the resulting solution using an evaporator, the residue was dried at room temperature overnight to obtain a compound shown by the following formula (C-4) (hereinafter referred to as "compound (C-4)") (yield: 8.1 g).

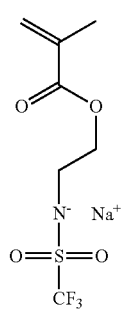

(X-3)

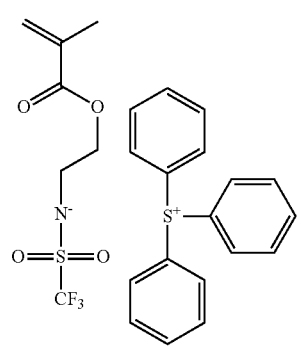

(C-4)

Each resin (A) was synthesized as described below. The monomers shown by the following formulas (M-1) to (M-7) were used to synthesize each resin (A).

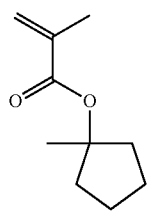 (M-1)

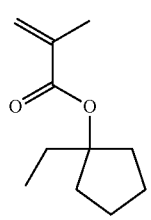 (M-2)

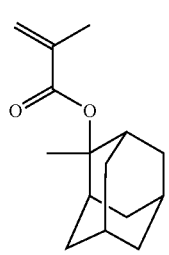 (M-3)

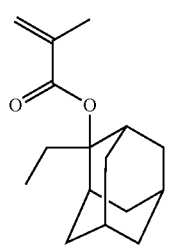 (M-4)

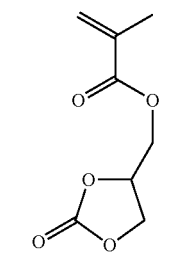 (M-5)

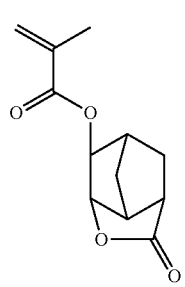 (M-6)

-continued

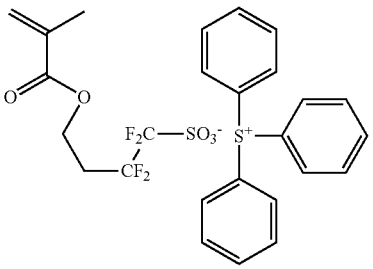 (M-7)

Synthesis Example 5

Production of Resin (A-1)

8.5 g (35 mol %) of the monomer shown by the formula (M-1) (hereinafter may be referred to as "monomer (M-1)"), 5.4 g (15 mol %) of the monomer shown by the formula (M-4) (hereinafter may be referred to as "monomer (M-4)"), and 16.1 g (50 mol %) of the monomer shown by the formula (M-6) (hereinafter may be referred to as "monomer (M-6)") were dissolved in 60 g of 2-butanone. 1.2 g of dimethyl azobisisobutyronitrile was added to the solution to prepare a monomer solution. A three-necked flask (200 ml) charged with 30 g of 2-butanone was purged with nitrogen for 30 minutes, and heated to 80° C. with stirring. The monomer solution was added dropwise to the flask using a dropping funnel over 3 hours. The monomers were polymerized for 6 hours from the start of addition of the monomer solution.

After completion of polymerization, the polymer solution was cooled with water to 30° C. or less, and added to 600 g of methanol. A white powder that precipitated by this operation was collected by filtration. The white powder thus collected was washed twice with 150 g of methanol in a slurry state, collected again by filtration, and dried at 50° C. for 17 hours to obtain a white powdery copolymer. The copolymer had an Mw of 6800 and a dispersity (Mw/Mn) of 1.38. The yield of the copolymer was 84.5%. The ratio of repeating units derived from the respective monomers ((M-1)/(M-4)/(M-6)) in the copolymer was 35.2/14.8/50.0 (mol %). The copolymer is hereinafter referred to as "resin (A-1)". Table 1 shows the type and the amount of each monomer used in Synthesis Example 5. Table 2 shows the Mw, the dispersity (Mw/Mn), and the yield of the resulting copolymer, and the ratio of repeating units derived from the respective monomers in the resulting copolymer.

Synthesis Examples 6 to 18

Synthesis of Resins (A-2) to (A-14)

A copolymer was produced in the same manner as in Synthesis Example 5, except for using the monomers shown in Table 1 in the amounts shown in Table 1. Table 2 shows the Mw, the dispersity (Mw/Mn), and the yield of the resulting copolymer, and the ratio of repeating units derived from the respective monomers in the resulting copolymer. The copolymers obtained in Synthesis Examples 6 to 18 are hereinafter referred to as "resin (A-2)" to "resin (A14)".

TABLE 1

| Resin (A) Type | | Monomer | | | | | | | Initiator Amount (mol %) |
|---|---|---|---|---|---|---|---|---|---|
| | | Type | Amount (mol %) | Type | Amount (mol %) | Type | Amount (mol %) | Type | Amount (mol %) | |
| Synthesis Example 5 | (A-1) | M-1 | 35 | M-4 | 15 | M-6 | 50 | — | — | 5 |
| Synthesis Example 6 | (A-2) | M-1 | 35 | M-3 | 15 | M-6 | 50 | — | — | 5 |
| Synthesis Example 7 | (A-3) | M-1 | 40 | M-4 | 10 | M-6 | 50 | — | — | 5 |
| Synthesis Example 8 | (A-4) | M-1 | 50 | M-6 | 50 | — | — | — | — | 5 |
| Synthesis Example 9 | (A-5) | M-3 | 60 | M-6 | 40 | — | — | — | — | 5 |
| Synthesis Example 10 | (A-6) | M-2 | 15 | M-3 | 35 | M-6 | 50 | — | — | 5 |
| Synthesis Example 11 | (A-7) | M-2 | 15 | M-3 | 35 | M-5 | 20 | M-6 | 30 | 5 |
| Synthesis Example 12 | (A-8) | M-1 | 15 | M-3 | 45 | M-5 | 20 | M-6 | 20 | 5 |
| Synthesis Example 13 | (A-9) | M-2 | 15 | M-3 | 45 | M-6 | 40 | — | — | 5 |
| Synthesis Example 14 | (A-10) | M-1 | 15 | M-3 | 45 | M-5 | 20 | M-6 | 20 | 10 |
| Synthesis Example 15 | (A-11) | M-2 | 15 | M-3 | 45 | M-5 | 20 | M-6 | 20 | 10 |
| Synthesis Example 16 | (A-12) | M-1 | 60 | M-6 | 40 | — | — | — | — | 5 |
| Synthesis Example 17 | (A-13) | M-1 | 46 | M-6 | 51 | M-7 | 3 | — | — | 5 |
| Synthesis Example 18 | (A-14) | M-2 | 15 | M-3 | 45 | M-5 | 40 | — | — | 10 |

TABLE 2

| | Resin (A) Type | Yield (%) | Content of repeating units derived from monomer | | | | | | | | Mw | Mw/Mn |
|---|---|---|---|---|---|---|---|---|---|---|---|---|
| | | | Type | Content (mol %) | Type | Content (mol %) | Type | Content (mol %) | Type | Content (mol %) | | |
| Synthesis Example 5 | (A-1) | 84.5 | M-1 | 35.2 | M-4 | 14.8 | M-6 | 50.0 | — | — | 6800 | 1.38 |
| Synthesis Example 6 | (A-2) | 84.3 | M-1 | 35.1 | M-3 | 14.7 | M-6 | 50.2 | — | — | 6700 | 1.39 |
| Synthesis Example 7 | (A-3) | 82.4 | M-1 | 39.7 | M-4 | 9.8 | M-6 | 50.5 | — | — | 6700 | 1.41 |
| Synthesis Example 8 | (A-4) | 79.8 | M-1 | 48.9 | M-6 | 51.1 | — | — | — | — | 6900 | 1.35 |
| Synthesis Example 9 | (A-5) | 86.2 | M-3 | 58.2 | M-6 | 41.8 | — | — | — | — | 5700 | 1.58 |
| Synthesis Example 10 | (A-6) | 83.2 | M-2 | 15 | M-3 | 34.8 | M-6 | 50.2 | — | — | 6700 | 1.43 |
| Synthesis Example 11 | (A-7) | 77.3 | M-2 | 14.6 | M-3 | 34.6 | M-5 | 20.1 | M-6 | 30.7 | 5300 | 1.45 |
| Synthesis Example 12 | (A-8) | 78.6 | M-1 | 14.7 | M-3 | 44.2 | M-5 | 20.2 | M-6 | 20.9 | 5400 | 1.39 |
| Synthesis Example 13 | (A-9) | 67.5 | M-2 | 15.3 | M-3 | 44.1 | M-6 | 40.6 | — | — | 4000 | 1.32 |
| Synthesis Example 14 | (A-10) | 62.5 | M-1 | 14.2 | M-3 | 44.7 | M-5 | 20.2 | M-6 | 20.9 | 3800 | 1.21 |
| Synthesis Example 15 | (A-11) | 632 | M-2 | 14.3 | M-3 | 44 | M-5 | 20.1 | M-6 | 21.6 | 3800 | 1.21 |
| Synthesis Example 16 | (A-12) | 71.2 | M-1 | 55.8 | M-6 | 44.2 | — | — | — | — | 5600 | 1.36 |
| Synthesis Example 17 | (A-13) | 72.3 | M-1 | 44.8 | M-6 | 52 | M-7 | 3.2 | — | — | 7200 | 1.45 |
| Synthesis Example 18 | (A-14) | 62.2 | M-2 | 14.6 | M-3 | 44.2 | M-5 | 41.2 | — | — | 4100 | 1.22 |

Example 1

Production of Radiation-Sensitive Resin Composition 100 parts of the resin (A-1) obtained in Synthesis Example 5, 8.5 parts of an acid generator (B-3), 4.5 parts of the compound (C-1) obtained in Synthesis Example 1, 1700 parts of a solvent (E-1), 700 parts of a solvent (E-2), and 30 parts of a solvent (E-3) were mixed to obtain a radiation-sensitive resin composition.

Examples 2 to 25 and Comparative Examples 1 to 3

Production of Radiation-Sensitive Resin Composition

A radiation-sensitive resin composition was obtained in the same manner as in Example 1, except for changing the composition as shown in Table 3.

TABLE 3

| | Component (parts by mass) | | | |
|---|---|---|---|---|
| | Resin (A) | Acid generator (B) | Compound (C) | Nitrogen-containing organic compound (D) |
| Example 1 | A-1 (100) | B-3 (8.5) | C-1 (4.5) | — |
| Example 2 | A-1 (100) | B-3 (15.0) | C-2 (4.5) | — |
| Example 3 | A-1 (100) | B-3 (15.0) | C-3 (4.5) | — |
| Example 4 | A-1 (100) | B-4 (10.8) | C-3 (5.0) | — |
| Example 5 | A-1 (100) | B-3 (15.0) | C-4 (4.5) | — |
| Example 6 | A-1 (100) | B-1 (4.5) B-2 (4.0) | C-1 (4.5) | — |
| Example 7 | A-2 (100) | B-3 (8.5) | C-1 (4.5) | — |
| Example 8 | A-3 (100) | B-3 (8.5) | C-1 (4.5) | — |
| Example 9 | A-4 (100) | B-3 (8.5) | C-1 (4.5) | — |
| Example 10 | A-5 (100) | B-3 (8.5) | C-1 (4.5) | — |
| Example 11 | A-6 (100) | B-5 (8.0) | C-3 (2.1) | — |
| Example 12 | A-7 (100) | B-5 (8.0) | C-3 (2.1) | — |
| Example 13 | A-8 (100) | B-5 (8.0) | C-3 (2.1) | — |
| Example 14 | A-9 (100) | B-5 (8.0) | C-3 (2.1) | — |
| Example 15 | A-4 (100) | B-3 (8.5) | C-1 (2.3) | D-1 (0.60) |
| Example 16 | A-4 (100) | B-3 (8.5) | C-3 (2.3) | D-1 (0.60) |
| Example 17 | A-10 (100) | B-5 (8.0) | C-3 (2.1) | — |
| Example 18 | A-11 (100) | B-5 (7.0) | C-3 (1.0) | — |
| Example 19 | A-11 (100) | B-5 (8.0) | C-3 (2.1) | — |
| Example 20 | A-12 (100) | B-5 (9.8) | C-3 (2.5) | — |
| Example 21 | A-13 (100) | — | C-3 (4.1) | — |
| Example 22 | A-13 (100) | — | C-1 (4.6) | — |
| Example 23 | A-13 (100) | — | C-4 (4.6) | — |
| Example 24 | A-11 (100) | B-6 (8.6) | C-3 (2.1) | — |
| Example 25 | A-14 (100) | B-5 (8.0) | C-3 (2.1) | — |
| Comparative Example 1 | A-4 (100) | B-3 (8.5) | — | D-1 (1.1) |
| Comparative Example 2 | A-5 (100) | B-3 (8.5) | — | D-1 (1.3) |
| Comparative Example 3 | A-4 (100) | B-3 (8.5) | — | — |

The details of the acid generator (B), the nitrogen-containing compound (D), and the solvent (C) are shown below.

Acid Generator (B)
(B-1): triphenylsulfonium nonafluoro-n-butanesulfonate
(B-2): triphenylsulfonium 2-(bicyclo[2.2.1]hept-2'-yl)-1,1-difluoroethanesulfonate
(B-3): triphenylsulfonium 2-(bicyclo[2.2.1]hept-2'-yl)-1,1,2,2-tetrafluoroethanesulfonate
(B-4): triphenylphosphonium 1,1,2,2-tetrafluoro-6-(1-adamantanecarbonyloxy)hexane-1-sulfonate
(B-5): triphenylphosphonium 2-adamantyl-1,1-difluoroethanesulfonate
(B-6): compound shown by the following formula (4)

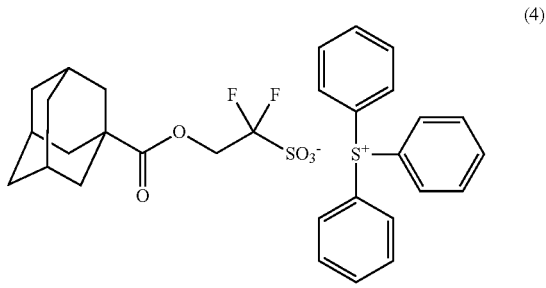

(4)

Nitrogen-Containing Compound (D)
(D-1): N-t-butoxycarbonyl-4-hydroxypiperidine
Solvent (E)
(E-1): propylene glycol monomethyl ether acetate
(E-2): cyclohexanone
(E-3): γ-butyrolactone (Evaluation of Radiation-Sensitive Resin Composition)

The radiation-sensitive resin compositions of Examples 1 to 25 and Comparative Examples 1 to 3 were evaluated as described below. The evaluation results are shown in Table 4.

Sensitivity (mJ)

A silicon wafer on which an ARC29 (manufactured by Nissan Chemical Industries, Ltd.) film (thickness: 77 nm) was formed, was used. The radiation-sensitive resin composition solution was spin-coated onto the silicon wafer using a coater/developer "Clean Track ACT 8" (manufactured by Tokyo Electron, Ltd.), and prebaked (PB) on a hot plate under the conditions shown in Table 4 to obtain a resist film having a thickness of 0.09 μm. The resist film was exposed via a mask pattern using an ArF excimer laser exposure system ("S306C" manufactured by Nikon Corporation) (numerical aperture: 0.78). After performing PEB under the conditions shown in Table 4, the resist film was developed at 23° C. for 60 seconds using a 2.38% tetramethylammonium hydroxide aqueous solution, rinsed with water, and dried to form a positive-tone resist pattern. A dose at which a line-and-space (1L1S) pattern having a diameter of 0.09 μm was formed via a mask having a diameter of 0.09 μm was determined to be an optimum dose, and the optimum dose was taken as the sensitivity.

Evaluation of Cross-Sectional Shape of Pattern

The cross-sectional shape of the line-and-space pattern (diameter: 0.075 μm) used to measure the sensitivity was observed using a scanning electron microscope ("S-4800" manufactured by Hitachi High-Technologies Corporation). A case where the line-and-space pattern had a T-top shape (i.e., a shape other than a rectangular shape) was evaluated as "Unacceptable", and a case where the line-and-space pattern had a rectangular shape was evaluated as "Acceptable".

Evaluation of LWR

A line-and-space pattern (diameter: 0.09 μm) formed on the substrate using the resist film at the optimum dose was observed from above using a scanning electron microscope ("S9380" manufactured by Hitachi Ltd.). The diameter was measured at arbitrary points, and a variation 3σ in diameter was evaluated. A case where the variation 3σ was 9.0 nm or less was evaluated as "Acceptable", and a case where the variation 3σ was more than 9.0 nm was evaluated as "Unacceptable".

Evaluation of Minimum Pre-Collapse Dimension

When the 90 nm line-and-space pattern (see sensitivity evaluation) is resolved at a dose higher than the optimum dose, the resulting pattern has a reduced line width, and the resist pattern collapses. A line width at the maximum dose at which the resist pattern does not collapse was defined as a minimum pre-collapse dimension (nm). The minimum pre-collapse dimension was used as an index of the pattern collapse resistance. A case where the minimum pre-collapse dimension was 40.0 nm or less was evaluated as "Acceptable", and a case where the minimum pre-collapse dimension was more than 40.0 nm was evaluated as "Unacceptable". The minimum pre-collapse dimension was measured using the above scanning electron microscope.

that showed small LWR and had an excellent pattern shape and excellent pattern collapse resistance (i.e., the resist pattern did not collapse even when forming a fine line pattern). Therefore, an accurate pattern could be formed. The radiation-sensitive resin compositions of Comparative Examples 1 and 2 that contained the nitrogen-containing organic compound (D), but did not contain the compound (C) exhibited an excellent pattern shape, but had large LWR and insufficient pattern collapse resistance. The radiation-sensitive resin composition of Comparative Example 3 that did not contain the compound (C) and the nitrogen-containing organic compound (D) showed large LWR, an inferior pattern shape, poor sensitivity, and insufficient pattern collapse resistance.

The radiation-sensitive resin composition according to the embodiments of the invention may suitably be used as a photoresist for which a reduction in line width of a resist pattern will be increasingly desired.

TABLE 4

| | PB | | PEB | | | | | Minimum pre-collapse |
|---|---|---|---|---|---|---|---|---|
| | Temp. (° C.) | Time (s) | Temp. (° C.) | Time (s) | Sensitivity (mJ) | Shape | LWR | dimension |
| Example 1 | 110 | 60 | 95 | 60 | 46 | Acceptable | Acceptable | Acceptable |
| Example 2 | 110 | 60 | 95 | 60 | 63 | Acceptable | Acceptable | Acceptable |
| Example 3 | 110 | 60 | 95 | 60 | 46 | Acceptable | Acceptable | Acceptable |
| Example 4 | 120 | 60 | 105 | 60 | 46 | Acceptable | Acceptable | Acceptable |
| Example 5 | 110 | 60 | 95 | 60 | 46 | Acceptable | Acceptable | Acceptable |
| Example 6 | 110 | 60 | 95 | 60 | 48 | Acceptable | Acceptable | Acceptable |
| Example 7 | 110 | 60 | 105 | 60 | 48 | Acceptable | Acceptable | Acceptable |
| Example 8 | 110 | 60 | 105 | 60 | 46 | Acceptable | Acceptable | Acceptable |
| Example 9 | 110 | 60 | 105 | 60 | 43 | Acceptable | Acceptable | Acceptable |
| Example 10 | 110 | 60 | 115 | 60 | 46 | Acceptable | Acceptable | Acceptable |
| Example 11 | 100 | 60 | 95 | 60 | 49 | Acceptable | Acceptable | Acceptable |
| Example 12 | 100 | 60 | 95 | 60 | 53 | Acceptable | Acceptable | Acceptable |
| Example 13 | 100 | 60 | 95 | 60 | 50 | Acceptable | Acceptable | Acceptable |
| Example 14 | 110 | 60 | 105 | 60 | 55 | Acceptable | Acceptable | Acceptable |
| Example 15 | 110 | 60 | 105 | 60 | 44 | Acceptable | Acceptable | Acceptable |
| Example 16 | 110 | 60 | 105 | 60 | 48 | Acceptable | Acceptable | Acceptable |
| Example 17 | 100 | 60 | 95 | 60 | 48 | Acceptable | Acceptable | Acceptable |
| Example 18 | 100 | 60 | 95 | 60 | 46 | Acceptable | Acceptable | Acceptable |
| Example 19 | 100 | 60 | 95 | 60 | 49 | Acceptable | Acceptable | Acceptable |
| Example 20 | 100 | 60 | 110 | 60 | 48 | Acceptable | Acceptable | Acceptable |
| Example 21 | 100 | 60 | 150 | 60 | 50 | Acceptable | Acceptable | Acceptable |
| Example 22 | 100 | 60 | 150 | 60 | 50 | Acceptable | Acceptable | Acceptable |
| Example 23 | 100 | 60 | 150 | 60 | 52 | Acceptable | Acceptable | Acceptable |
| Example 24 | 100 | 60 | 90 | 60 | 44 | Acceptable | Acceptable | Acceptable |
| Example 25 | 100 | 60 | 90 | 60 | 48 | Acceptable | Acceptable | Acceptable |
| Comparative Example 1 | 110 | 60 | 105 | 60 | 45 | Acceptable | Unacceptable | Unacceptable |
| Comparative Example 2 | 110 | 60 | 115 | 60 | 48 | Acceptable | Unacceptable | Unacceptable |
| Comparative Example 3 | 110 | 60 | 105 | 60 | <20 | Unacceptable | Unacceptable | Unacceptable |

As shown in Table 4, the radiation-sensitive resin compositions according to the examples could form a resist pattern Obviously, numerous modifications and variations of the present invention are possible in light of the above teachings.

It is therefore to be understood that within the scope of the appended claims, the invention may be practiced otherwise than as specifically described herein.

The invention claimed is:

1. A radiation-sensitive resin composition comprising:
an acid-labile group-containing resin; and
a compound shown by a general formula (i),

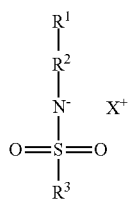
(i)

wherein
R¹ represents a hydrogen atom, a linear or branched unsubstituted monovalent hydrocarbon group having 1 to 10 carbon atoms, a linear or branched monovalent hydrocarbon group having 1 to 10 carbon atoms in which at least one hydrogen atom is substituted with a fluorine atom, a hydroxyl group, an —OR group, an —OCOR group, a —COOR group, or a monovalent hydrocarbon group having 3 to 20 carbon atoms in which all of the carbon atoms or a part of the carbon atoms form a cyclic structure, wherein R represents a linear or branched monovalent hydrocarbon group having 1 to 10 carbon atoms or a monovalent hydrocarbon group having 3 to 20 carbon atoms in which all of the carbon atoms or a part of the carbon atoms form a cyclic structure, R² represents a single bond or an —O—(C=O)— group, R³ represents a linear or branched unsubstituted monovalent hydrocarbon group having 1 to 10 carbon atoms, a linear or branched monovalent hydrocarbon group having 1 to 10 carbon atoms in which at least one hydrogen atom is substituted with a fluorine atom, or a monovalent hydrocarbon group having 3 to 20 carbon atoms in which all of the carbon atoms or a part of the carbon atoms form a cyclic structure, and X⁺ represents an onium cation.

2. The radiation-sensitive resin composition according to claim 1, wherein X⁺ in the general formula (i) is an onium cation shown by a general formula (1-1), an onium cation shown by a general formula (1-2) or a combination thereof,

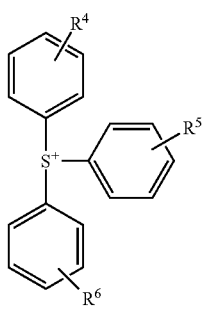
(1-1)

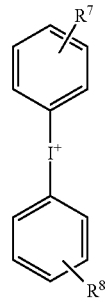
(1-2)

wherein each of R⁴ to R⁸ individually represents a hydrogen atom, a hydroxyl group, a nitro group, a halogen atom, a substituted or unsubstituted alkyl group having 1 to 10 carbon atoms, a cycloalkyl group having 3 to 12 carbon atoms, or an alkoxy group having 1 to 10 carbon atoms.

3. The radiation-sensitive resin composition according to claim 1, further comprising a photo acid generator.

4. The radiation-sensitive resin composition according to claim 1, wherein the acid-labile group-containing resin includes a repeating unit shown by a general formula (2),

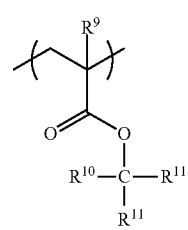
(2)

wherein
R⁹ represents a hydrogen atom, a methyl group, or a trifluoromethyl group, R¹⁰ represents an alkyl group having 1 to 4 carbon atoms or a monovalent alicyclic hydrocarbon group having 4 to 20 carbon atoms, and each of R¹¹ individually represents an alkyl group having 1 to 4 carbon atoms or a monovalent alicyclic hydrocarbon group having 4 to 20 carbon atoms, or each of R¹¹ individually represents an alkyl group having 1 to 4 carbon atoms or a monovalent alicyclic hydrocarbon group having 4 to 20 carbon atoms, and each of R¹¹ bonds to each other to form a divalent alicyclic hydrocarbon group having 4 to 20 carbon atoms together with a carbon atom bonded to R¹¹.

* * * * *